(12) United States Patent
Mu (10) Patent No.: US 11,887,853 B2
(45) Date of Patent: Jan. 30, 2024

(54) METHOD OF MANUFACTURING SEMICONDUCTOR DEVICE

(71) Applicant: CHANGXIN MEMORY TECHNOLOGIES, INC., Hefei (CN)

(72) Inventor: Kejun Mu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 224 days.

(21) Appl. No.: 17/459,610

(22) Filed: Aug. 27, 2021

(65) Prior Publication Data

US 2021/0391175 A1 Dec. 16, 2021

Related U.S. Application Data

(63) Continuation of application No. PCT/CN2021/076253, filed on Feb. 9, 2021.

(30) Foreign Application Priority Data

Feb. 25, 2020 (CN) .......................... 202010115668.6

(51) Int. Cl.
*H01L 21/265* (2006.01)
*H01L 29/08* (2006.01)
(Continued)

(52) U.S. Cl.
CPC .... *H01L 21/26586* (2013.01); *H01L 29/0847* (2013.01); *H01L 29/6659* (2013.01); *H01L 29/7833* (2013.01)

(58) Field of Classification Search
None
See application file for complete search history.

(56) References Cited

U.S. PATENT DOCUMENTS 6,489,223 B1* 12/2002 Hook ................ H01L 21/26586
257/E21.345
2003/0008484 A1* 1/2003 Hook .............. H01L 21/823418
257/E21.345
(Continued)

FOREIGN PATENT DOCUMENTS

CN 101728263 A 6/2010
CN 102087979 A 6/2011
(Continued)

OTHER PUBLICATIONS

Office Action of Chinese Patent Application No. 202010115668.6, dated May 19, 2022.
(Continued)

*Primary Examiner* — Cory W Eskridge
(74) *Attorney, Agent, or Firm* — Ladas & Parry LLP (57) ABSTRACT

A method of manufacturing a semiconductor device comprises: forming a doped region having a first conductive type in a semiconductor substrate, and forming a gate structure on the doped region; implanting doping ions having a second conductive type to a second region of the doped region along a vertical direction, so as to form a source/drain region having the second conductive type; implanting doping ions having the first conductive type to a first region of the doped region along a tilt direction inclining toward the gate structure, and then annealing, so as to form a Halo region extending to the gate structure from the source/drain region, wherein the first region is adjacent to the gate structure and the second region is located on the side of the first region facing away from the gate structure, and the first region and the second region have no overlap region.

14 Claims, 7 Drawing Sheets

(51) Int. Cl.
  *H01L 29/66* (2006.01)
  *H01L 29/78* (2006.01)

(56) References Cited

U.S. PATENT DOCUMENTS

| | | | |
|---|---|---|---|
| 2003/0032229 A1* | 2/2003 | Roberts | H01L 21/823425 257/E21.654 |
| 2005/0077573 A1 | 4/2005 | Kim | |
| 2006/0134889 A1 | 6/2006 | Sadra et al. | |
| 2010/0244131 A1 | 9/2010 | Bulucea et al. | |

FOREIGN PATENT DOCUMENTS

| | | |
|---|---|---|
| CN | 104779167 A | 7/2015 |
| CN | 105870003 A | 8/2016 |
| CN | 106033730 A | 10/2016 |

OTHER PUBLICATIONS

ISR_and_Written_Opinion_for_International_Application_PCTCN2021076253 dated May 8, 2021.

* cited by examiner

METHOD OF MANUFACTURING SEMICONDUCTOR DEVICE

CROSS-REFERENCE TO RELATED APPLICATIONS

This application is a continuation of International Patent Application No. PCT/CN2021/076253, filed on Feb. 9, 2021, which claims priority to Chinese Patent Application No. 202010115668.6, filed on Feb. 25, 2020. The entire contents of the aforementioned patent applications are incorporated herein by reference.

TECHNICAL FIELD

The claimed invention relates to a method of manufacturing a semiconductor device.

BACKGROUND

During the manufacture of a semiconductor device, in order to reduce a short channel effect of the device and suppress threshold voltage sag, a heavily doped Halo region is usually formed on a side of a source/drain region close to a channel region. The Halo region has a conductive type opposite to the source/drain region.

SUMMARY

According to some embodiments, the present application provides a method of manufacturing a semiconductor device, including:
forming a doped region having a first conductive type, and forming a gate structure on the doped region; and
implanting doping ions having the first conductive type to a first region of the doped region along a tilt direction inclining toward the gate structure, and then annealing, so as to form a Halo region; implanting doping ions having a second conductive type to a second region of the doped region along a vertical direction, so as to form a source/drain region having the second conductive type; wherein the first region is adjacent to the gate structure and the second region is located on the side of the first region facing away from the gate structure, and the first region and the second region have no overlap region, and wherein the Halo region is located on the side of the source/drain region facing the gate structure and extends to the gate structure from a side surface of the source/drain region and contacts a bottom surface of the gate structure.

Other features and advantages of the present application will become apparent from the description, the drawings, and the claims.

BRIEF DESCRIPTION OF DRAWINGS

In order to more clearly illustrate the embodiments of the present application or the technical solutions of the traditional technology, the accompanying drawings required to be used in the description of the embodiments or traditional techniques will be briefly introduced below. Apparently, the accompanying drawings in the following description show merely some embodiments of the present application, and persons of ordinary skill in the art may still derive other drawings from these accompanying drawings without creative efforts.

DESCRIPTION OF REFERENCE NUMERALS 100 semiconductor substrate;
110 doped region;
111 first region;
112 dopant implanted region;
113 LDD region;
114 Halo region;
120 source/drain region;
121 second region;
122 first doped part;
123 second doped part;
200 gate structure;
210 gate dielectric layer;
220 gate conductive layer;
300 mask;
400 first dielectric layer; and
410 isolating side wall.

DESCRIPTION OF EMBODIMENTS

During an electrical performance test of a semiconductor device, an electric leakage phenomenon of the semiconductor device is relatively obvious. A large electric leakage would cause the device to have a large power loss, thereby affecting the stability and lifetime of the device.

In order to facilitate to understand the present invention, a more complete description of the present invention is provided below with reference to the relevant drawings. Preferred embodiments of the present invention are given in the drawings. However, the present invention may be implemented in a number of different ways without limiting to the embodiments described herein. Instead, the purposes of providing these embodiments are leading to a more thorough and complete understanding of the disclosure of the present invention.

Unless otherwise defined, all of the technical and scientific terms used herein have the same meanings as would generally understood by the person skilled in the technical field of the present invention. In this document, the terms used in the description of the present invention is merely for the purpose of describing particular embodiments, and is not intended to limit the present invention. The term "and/or" as used herein includes any or all combinations of one or more relevant items which are listed.

Figure 1:
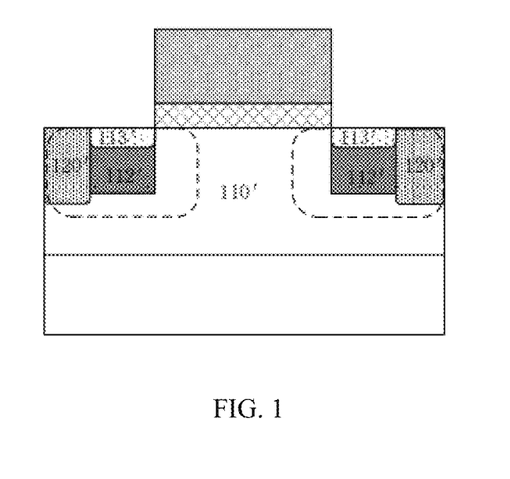
FIG. 1 is a partial sectional view of a traditional semiconductor device.

A partial sectional view of a traditional semiconductor device is shown in FIG. 1. In a traditional art, Halo regions 112' and source/drain regions 120' are formed in a surface layer of a doped region 110' with each Halo region and each source/drain region arranged side by side, and an LDD region 113' is further formed within each Halo region 112'. The Halo region 112' and the doped region 110' each have a first conductive type, and the Halo region 112' has a doping concentration greater than the doped region 110'. The source/drain region 120' and the LDD region 113' each have a second conductive type. The Halo region 112' and the LDD region 113' form a Halo-LDD structure. In a traditional manufacturing process, the Halo region 112' and the source/ drain region 120', which are adjacent to each other, are separately formed by vertically implanting doping ions. According to a study, the present applicant finds that, in a subsequent high temperature annealing process, the Halo region 112' would diffuse to its surroundings (within the range of a dashed box shown in the drawing), and readily to beneath the source/drain region 120' to contact its bottom, so that the source/drain region 120' and the Halo region 112' form an abrupt junction in the vertical direction, thereby increasing a vertical junction leakage.

To this end, the present application presents a novel method of manufacturing a semiconductor device, which can avoid the vertical junction leakage above.

Figure 2:
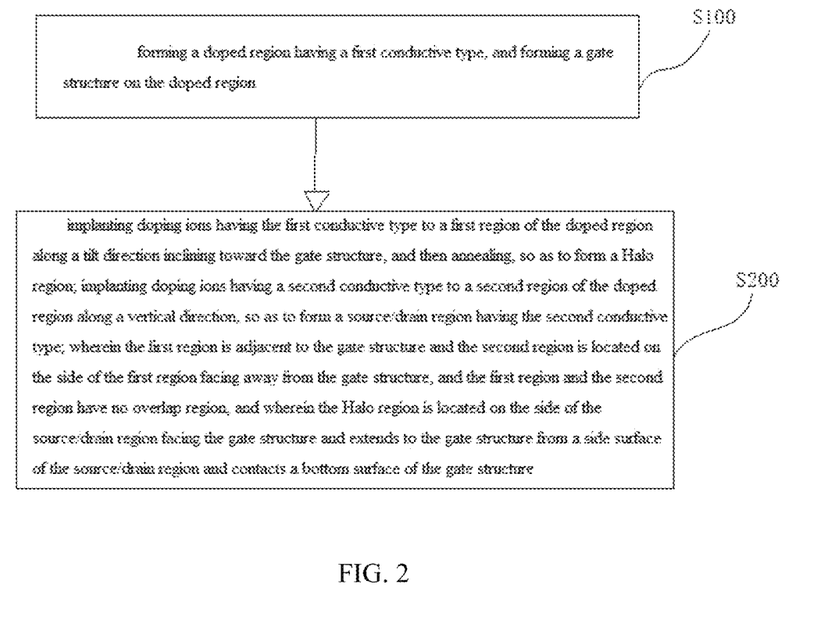
FIG. 2 is a flowchart of steps of a method of manufacturing a semiconductor device according to an embodiment of the present application.

A flowchart of steps of a method of manufacturing a semiconductor device is shown in FIG. 2. The method includes the following steps.

Step S100: forming a doped region having a first conductive type, and forming a gate structure on the doped region.

Figure 4A:
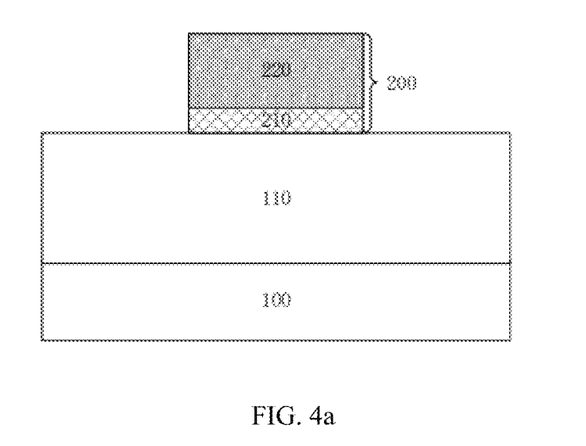
FIGS. 4a-4h are schematic diagrams of structures formed through relevant steps of the method of manufacturing a semiconductor device according to an embodiment.

Referring to FIG. 4a, a doped region 110 having a first conductive type is formed. Specifically, the doped region 110 may be a semiconductor substrate having the first conductive type. In another embodiment, the doped region 110 may also be a well region having the first conductive type formed in a semiconductor substrate 100. A gate structure is further formed on the doped region 110. The gate structure 200 includes a gate dielectric layer 210 contacting the doped region 110 and a gate conductive layer 220 stacked on the gate dielectric layer 210, wherein the gate dielectric layer 210 may be made of silicon oxide, and the gate conductive layer 220 may be made of polycrystalline silicon.

Step S200: implanting doping ions having the first conductive type to a first region of the doped region along a tilt direction inclining toward the gate structure, and then annealing, so as to form a Halo region; implanting doping ions having a second conductive type to a second region of the doped region along a vertical direction, so as to form a source/drain region having the second conductive type; wherein the first region is adjacent to the gate structure and the second region is located on the side of the first region facing away from the gate structure, and the first region and the second region have no overlap region, and wherein the Halo region is located on the side of the source/drain region facing the gate structure and extends to the gate structure from a side surface of the source/drain region and contacts a bottom surface of the gate structure.

Figure 4B:
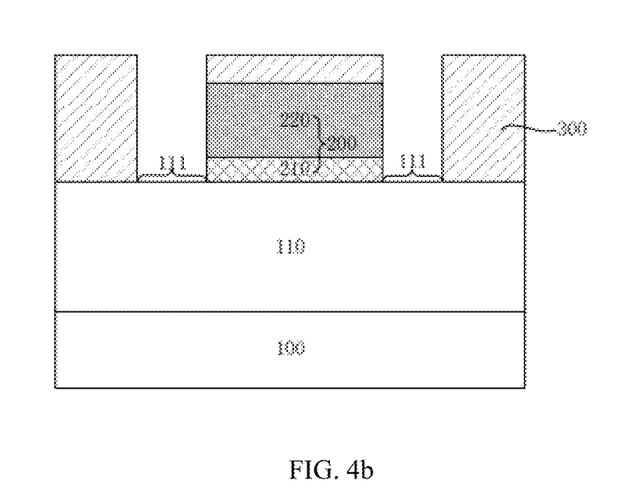

Referring to FIG. 4b, a source/drain region 120 and a Halo region 114 extending to the gate structure 200 from the side surface of the source/drain region 120 are formed in the doped region 110. That is, the Halo region 114 is located on the side of the source/drain region 120 facing the gate structure 200 and extends to the gate structure 200 from the side surface of the source/drain region 120 facing the gate structure 200 and contacts the bottom surface of the gate structure 200. The Halo region 114 has a first conductive type, and its doping concentration is higher than that of the doped region 110. The source/drain region 120 has a second conductive type and is electrically connected to an electrode.

The process of forming the source/drain region 120 includes implanting doping ions having the second conductive type to a second region 121 of the doped region 110 along the vertical direction so as to form the source/drain region 120 having the second conductive type.

The process of forming the Halo region 114 includes implanting doping ions having the first conductive type to the doped region 110 along a tilt direction inclining toward the gate structure 200, and then annealing, so as to form the Halo region extending to the gate structure 200 from the side surface of the source/drain region 120. A first region 111 is adjacent to the gate structure 200, and the second region 121 is located on the side of the first region 111 facing away from the gate structure 200. The first region 111 and the second region 121 have no overlap region. That is, in the process of forming the Halo region, the doping ions having the first conductive type are not implanted into the second region 121. It should be noted that implanting doping ions to the doped region 110 along a tilt direction inclining toward the gate structure 200 refers to an incident path of the doping ions above the doped region getting closer to the gate structure 200 from top to bottom. In the process of forming the Halo region 114, the doping ions are not implanted into the source/drain region. The dopant implanted region formed extends downward in a direction away from the source/drain region 120 and has a space from the bottom of the source/drain region 120. The annealing is then conducted, and the dopant implanted region diffuses toward the source/drain region 120 to form the Halo region 114 in contact with the source/drain region 120, At this point, since the dopant implanted region has a space from the bottom of the source/drain region 120, the dopant implanted region can be prevented from diffusing to the bottom of the source/drain region 120, i.e., the semiconductor device formed by the method above has no Halo region 114 at the bottom of the source/drain region 120. It should be noted that the direction perpendicular to an upper surface of the semiconductor substrate 100 is used as the vertical direction, and the tilt direction refers to the direction deviating from the vertical direction by an included angle (greater than 0 and smaller than 90°).

The first conductive type is one of P type and N type, and the second conductive type is the other one of P type and N type. For example, if the first conductive type is P type, the second conductive type is N type, and if the first conductive type is N type, the second conductive type is P type.

As introduced above, since the Halo region 114 has a doping concentration higher than the doped region 110, once the Halo region 114 diffuses to beneath the source/drain region 120 and contacts the bottom surface thereof, an abrupt junction would be formed by the Halo region 114 and the source/drain region 120 in the vertical direction, resulting in a vertical junction leakage. In the present application, by improving the way of implanting the Halo region 114, the doping ions are implanted to the doped region 110 along the tilt direction facing away from the source/drain region 120 so as to form the inclined dopant implanted region. Also, the first region and the second region have no overlap, i.e., the doping ions forming the Halo region will not be implanted into the source/drain region 120 of the second region 121. The space between the dopant implanted region and the source/drain region 120 is gradually increasing in a downward direction. After subjected to the subsequent high temperature annealing process, the dopant implanted region diffuses to the surroundings. However, due to the space between the dopant implanted region and the bottom of the source/drain region 120, the dopant implanted region can be prevented from diffusing to the bottom of the source/drain region 120, thereby avoiding the vertical junction leakage caused by the formation of an abrupt junction beneath the source/drain region 120. In other words, the semiconductor device manufactured by using the method according to the present application can avoid the junction leakage in the vertical direction and improve the stability of the device without changing the structure of the semiconductor device (having Halo regions).

Specifically, in the step S200, the processes of forming the Halo region 114 and the source/drain region 120 may be flexibly changed. In an embodiment, the Halo region 114 may be formed first, and then the source/drain region 120 is formed. In another embodiment, the source/drain region 120 may also be formed first, and then the Halo region 114 is formed.

Figure 3:
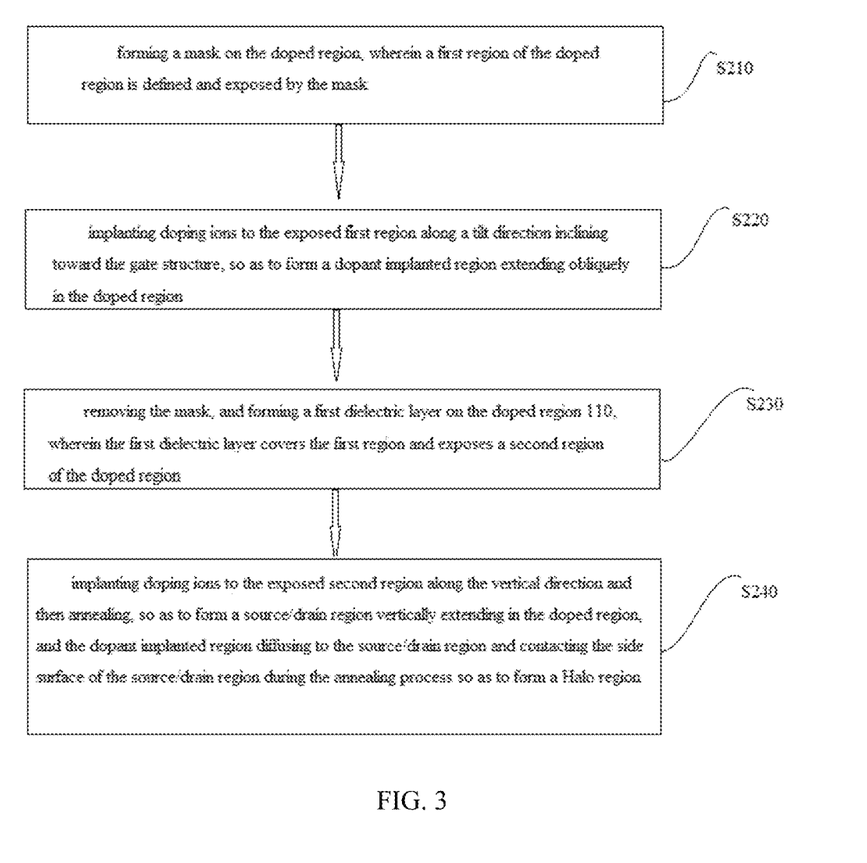
FIG. 3 is a flowchart of sub-steps of step S200 according to an embodiment of the present application.

An implementation of the step S200 is listed below. That is, as shown in FIG. 3, the step S200 according to an embodiment includes the following steps.

Step S210: forming a mask on the doped region, wherein a first region of the doped region is defined and exposed by the mask.

Referring to FIG. 4b, a mask 300 is formed on the doped region 110, and a first region 111 of the doped region 110 is defined and exposed by the mask 300. That is, the mask 300 covers the regions on the doped region 110 other than the first region 111, and exposes only the first region 111. Specifically, the mask 300 may be made of a photoresist material, such as optical resist. Specifically, the mask 300 also covers the upper surface of the gate structure 200. Further, the first region 111 abuts the gate structure 200, i.e., a section of the doped region 110 which extends from the boundary of the gate structure 200 to one side thereof is selected as the first region 111.

Step S220: implanting doping ions to the exposed first region along a tilt direction inclining toward the gate structure, so as to form a dopant implanted region extending obliquely in the doped region.

Figure 4C:
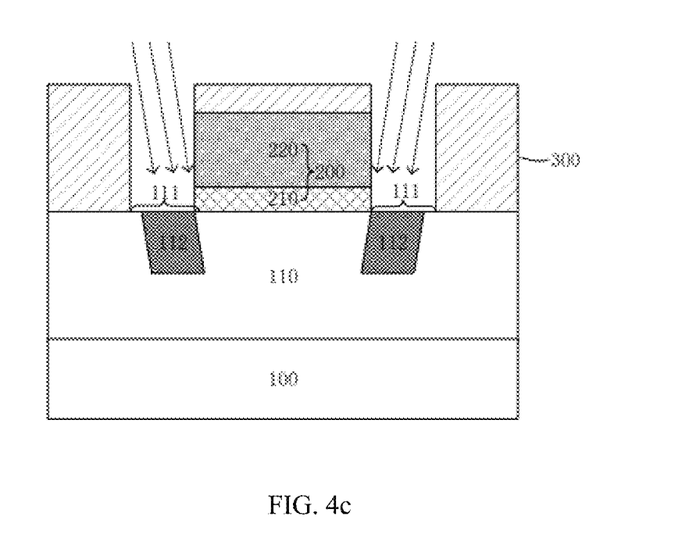

Referring to FIG. 4c, doping ions having a first conductive type are implanted along the tilt direction inclining toward the gate structure 200. Due to block of the mask 300, the doping ions are implanted into the doped region 110 through the first region 111 only, forming the dopant implanted region 112 extending obliquely. For the mean time, with the protection of the mask 300, a second region 121 of the doped region 110 is not influenced by the ion implant. That is, the source/drain region 120 formed subsequently will not be doped with the doping ions having the first conductive type, and thus, the Halo region is further prevented from diffusing to beneath the source/drain region 120.

Figure 4D:
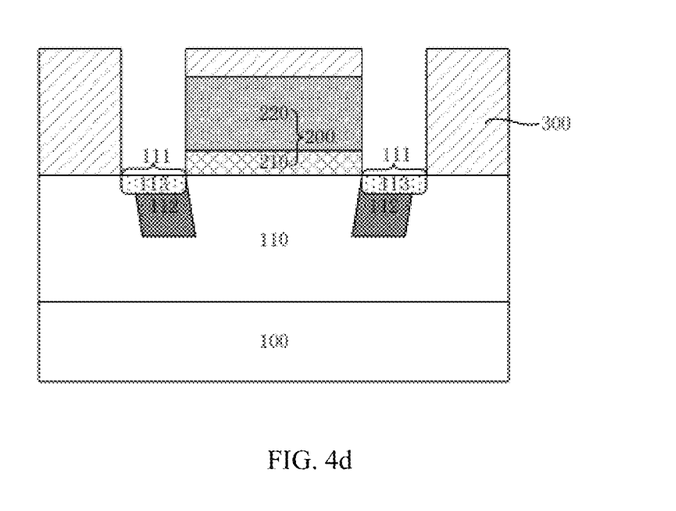

In an embodiment, referring to FIG. 4d, after the dopant implanted region 112 is formed, the method further includes forming an LDD region 113 having a second conductive type on the surface layer of the dopant implanted region 112, namely, after implanting the doping ions having the first conductive type through the mask 300 so as to form the dopant implanted region 112, continuing to implanting the doping ions having the second conductive type so as to form the LDD region 113.

Step S230: removing the mask, and forming a first dielectric layer on the doped region 110, wherein the first dielectric layer covers the first region and exposes a second region of the doped region.

The mask 300 is removed, and a first dielectric layer 400 is formed on the doped region 110. The first dielectric layer 400 covers the first region 111 and exposes the second region 121 of the doped region 110. The first region 111 and the second region 121 have no overlap, i.e., the first region 111 and the second region 121 are at different locations of the doped region 110. Specifically, the second region 121 may abut the first region 111. At this point, the first region 111 and the second region 121 in order extends from the gate structure 200 to each side thereof, and the gate structure 200, the first region 111, and the second region 121 are distributed side-by-side in a same direction.

In an embodiment, after the mask 300 is removed, the step S230 can be divided into the following sub-steps.

Step S231: depositing a first dielectric layer covering the upper surface of the doped region, wherein the first dielectric layer has a thickness equal to a width of the first region.

Figure 4E:
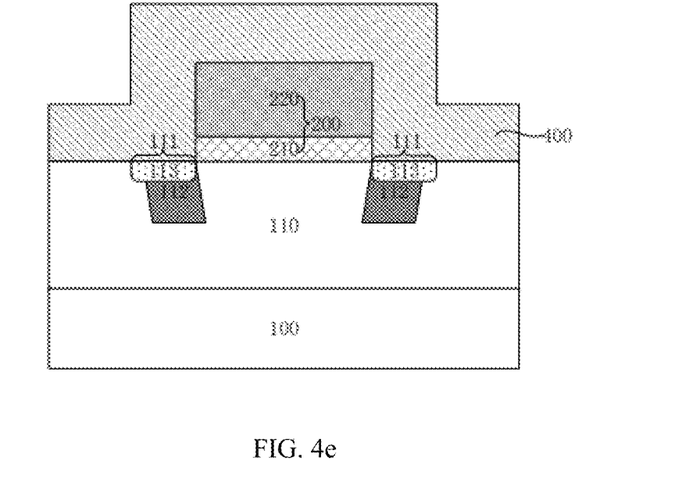

Referring to FIG. 4e, a first dielectric layer 400 covering the upper surface of the doped region 110 is deposited on the doped region 110. The thickness of the first dielectric layer 400 is controlled to be equal to the width of the first region 111.

Step S232: etching back the first dielectric layer to remove the first dielectric layer located on the upper surface of the gate structure and located on the doped region other than the first region while keeping the first dielectric layer which covers the first region, so as to form an isolating side wall of the gate structure, by which the second region is defined.

Figure 4F:
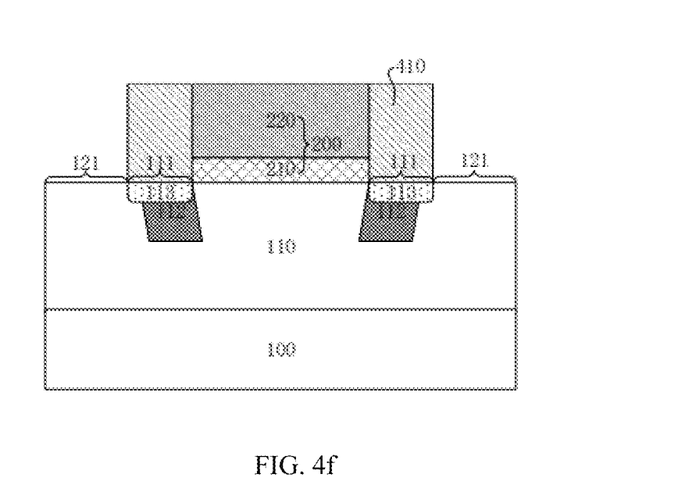

Referring to FIG. 4f, an anisotropic etch is performed on the first dielectric layer 400 and an etching direction is vertically downward. The first dielectric layer 400 located on the gate structure 200 and the second region 121 is etched off while keeping the first dielectric layer 400 located on the side wall of the gate structure 200, so as to form the isolating side wall 410. Since the first dielectric layer 400 has a deposition thickness equal to the width of the first region, the isolating side wall 410, which is kept, exactly covers the first region 111. Therefore, the isolating side wall 410 kept after being etched back can cover the first region 111 and exposes the second region 121.

Step S240: implanting doping ions to the exposed second region along the vertical direction and then annealing, so as to form a source/drain region vertically extending in the doped region, and the dopant implanted region diffusing to the source/drain region and contacts the side surface of the source/drain region during the annealing process so as to form a Halo region.

Figure 4G:
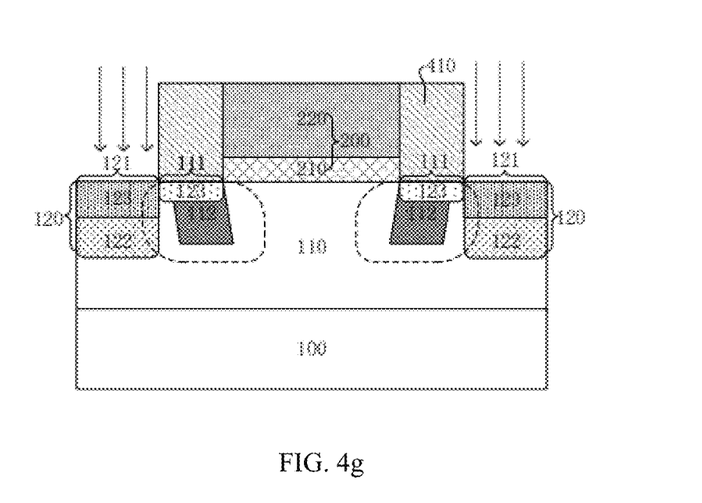
Figure 4H:
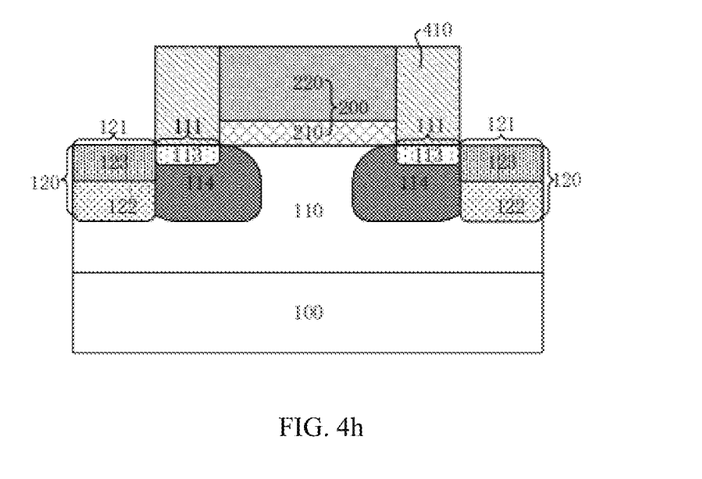

Referring to FIG. 4g, the doping ions having the second conductive type are implanted along the vertical direction, and the source/drain region 120 extending vertically is formed in the second region 121. The first region 111 is protected by the first dielectric layer (e.g., the isolating side wall 410) from the influence of doping. At this point, the bottom of the dopant implanted region 112 keeps a distance from the bottom of the source/drain region 120. A high temperature annealing is conducted after the implantation of the doping ions. As shown in the combination of FIGS. 4g and 4h, during the annealing process, the dopant implanted region 112 may diffuse to the surroundings (such as the range of the dashed box shown in the drawing) and gradually approach the source/drain region 120, forming the Halo region 114 which contacts the side surface of the source/drain region 120. The Halo region 114 serves as the Halo region, and the LDD region 113 serves as the LDD region. The Halo region 114 and the LDD region 113 form a Halo-LDD structure. Since the bottom of the dopant implanted region 112 keeps a distance from the bottom of the source/drain region 120, the dopant implanted region 112 can be prevented from diffusing to the bottom of the source/drain region 120 and thus from contacting the bottom surface of the source/drain region 120, i.e., avoiding electric leakage due to the abrupt junction formed at the Halo region 114 and the source/drain region 120 in the vertical direction. An angle of inclination may be adjusted based on the doping concentration and doping depth of the Halo region 114, and thus, the space between the dopant implanted region 112 and the source/drain region 120 is adjusted to ensure that the Halo region 114 formed after the annealing process will not diffuse to the bottom of the source/drain region 120 or contact the bottom surface of the source/drain region 120. In the embodiment above, the annealing occurs after the ion implantation of the second region 121. However, in other embodiments, the annealing process may also be conducted immediately after the dopant implanted region 112 is formed, and then the source/drain region 120 is manufactured, as long as the annealing step is performed after the dopant implanted region 112 is formed. It should be noted that, during the annealing process, the doping ions having the first conductive type located in the dopant implanted region 112 may also diffuse into the inside of the source/drain region 120. However, since the concentration of the doping ions having the second conductive type located in the source/drain region 120 is greater than the concentration of the doping ions having the first conductive type diffused into the inside of the source/drain region 120, the conductive property of the source/drain region 120 would not change even if a part of the doping ions having the first conductive type is diffused into the source/drain region 120. That is, only the source/drain region 120, but not the Halo region, is formed in the second region 121.

In an embodiment, the doping concentration of the source/drain region 120 gradually decreases from the top to the bottom thereof. The source/drain region 120 has a low concentration at its bottom, such that the source/drain region 120 and the doped region 110 form an abrupt junction in the vertical direction. The high concentration at the top of the source/drain region 120 may reduce a contact resistance between the source/drain region 120 and the electrode. Specifically, the source/drain region 120 includes a first doped part 122 located at the bottom and a second doped part located at the top. The first doped part 122 has a doping concentration lower than the second doped part 123.

It can be appreciated that, after the Halo region 114 and the source/drain region 120 are formed, it may be also required to form an electrode electrically connected to the source/drain region 120. Therefore, after the step S200, the method according to an embodiment further includes:

Step S300: depositing a second dielectric layer covering the upper surface of the semiconductor substrate, wherein the second dielectric layer is provided with a contact hole for exposing a part of the source/drain region, and the contact hole has a width less than the source/drain region; and filling an electrode material in the contact hole to form an electrode electrically connected to the source/drain region.

In an embodiment, the semiconductor device described above includes a MOSFET (Metal-Oxide-Semiconductor Field-Effect Transistor), and the above source/drain region 120 formed in the doped region 110 is the source region and/or the drain region of the MOSFET. It should be appreciated that the semiconductor device described above is not limited to a MSOFET structure, and the source/drain region 120 described above may also be the electrified source/drain region 120 of other active devices. Alternatively, the semiconductor device described above is a dynamic random access memory (DRAM) containing the above MOSFET structure. To be sure, it is not limited to the dynamic random access memory, and may also be other semiconductor devices containing the above MOSFET structure.

In the above method of manufacturing a semiconductor device, by improving the way of implanting the Halo region 114, the doping ions are implanted to the first region 111 of the doped region 110 along the tilt direction inclining toward the gate structure 200 so as to form the dopant implanted region 112. Also, the first region 111 and the second region 121 have no overlap, i.e., the doping ions forming the Halo region will not be implanted into the source/drain region of the second region 121. The space between the dopant implanted region forming the Halo region and the source/drain region is gradually increasing in a downward direction. After subjected to the subsequent high temperature annealing process, the dopant implanted region 112 diffuses to the surroundings. However, due to the space between the dopant implanted region 112 and the bottom of the source/drain region 120, the dopant implanted region can be prevented from diffusing to the bottom of the source/drain region 120, thereby avoiding the vertical junction leakage caused by the formation of the abrupt junction beneath the source/drain region 120. In other words, the semiconductor device manufactured by using the method according to the present application can avoid the junction leakage in the vertical direction and improve the stability of the device without changing the structure of the semiconductor device (having Halo regions).

The embodiments described above merely show several implementations of the present invention. The descriptions thereof are specific and detailed, but should not be interpreted as limiting the scope of the invention patent. It should be noted that the person skilled in the art could further make several variations and improvements without departing the present inventive concept, and these variations and improvements belong to the scope sought for protection in the present invention. Therefore, the protection scope of the present invention shall be subject to the claims.

What is claimed is:

1. A method of manufacturing a semiconductor device, comprising:

forming a doped region having a first conductive type, and forming a gate structure on the doped region;

implanting doping ions having the first conductive type to a first region of the doped region along a tilt direction inclining toward the gate structure, and then annealing, so as to form a Halo region; and implanting doping ions having a second conductive type to a second region of the doped region along a vertical direction, so as to form a source/drain region having the second conductive type;

wherein the step of implanting the doping ions and then annealing, so as to form a Halo region, comprises:

forming a mask on the doped region, the first region of the doped region being defined and exposed by the mask;

implanting the doping ions to the exposed first region along the tilt direction inclining toward the gate structure, so as to form a dopant implanted region extending obliquely in the doped region; and annealing, so that the dopant implanted region diffuses to surroundings so as to form the Halo region;

wherein the first region is adjacent to the gate structure and the second region is located on the side of the first region facing away from the gate structure, and the first region and the second region have no overlap region, and wherein the Halo region is located on the side of the source/drain region facing the gate structure and extends to the gate structure from a side surface of the source/drain region and contacts a bottom surface of the gate structure.

2. The method of manufacturing the semiconductor device according to claim 1, wherein the step of implanting doping ions having a second conductive type to a second region of the doped region along a vertical direction so as to form a source/drain region having the second conductive type comprises:

removing the mask, and forming on the doped region a first dielectric layer which covers the first region and exposes the second region of the doped region; and implanting the doping ions to the exposed second region along the vertical direction, so as to form the source/drain region vertically extending in the doped region.

3. The method of manufacturing the semiconductor device according to claim 1, wherein the mask serves as a photoresist.

4. The method of manufacturing the semiconductor device according to claim 1, after the dopant implanted region is formed in the doped region, further comprising:

forming a lightly doe drain (LDD) region on a surface layer of the dopant implanted region, wherein the LDD region has the second conductive type and has a doping concentration lower than the source/drain region.

5. The method of manufacturing the semiconductor device according to claim 2, wherein the first region abuts the second region.

6. The method of manufacturing the semiconductor device according to claim 2, wherein the gate structure abuts the first region, and the gate structure, the first region, and the second region are distributed side-by-side in a same direction, and the mask covers an upper surface of the gate structure.

7. The method of manufacturing the semiconductor device according to claim 6, wherein the step of forming on the doped region a first dielectric layer which covers the first region and exposes the second region of the doped region comprises:

depositing the first dielectric layer covering an upper surface of the doped region, the first dielectric layer having a thickness equal to a width of the first region; and etching back the first dielectric layer to remove the first dielectric layer located on the upper surface of the gate structure and located on the doped region other than the first region while keeping the first dielectric layer which covers the first region, so as to form an isolating side wall of the gate structure, by which the second region is defined.

8. The method of manufacturing the semiconductor device according to claim 1, wherein a doping concentration of the source/drain region decrements from a top to a bottom.

9. The method of manufacturing the semiconductor device according to claim 1, further comprising:

depositing a second dielectric layer covering an upper surface of the doped region, wherein the second dielectric layer is provided with a contact hole for exposing a part of the source/drain region, and the contact hole has a width less than the source/drain region; and filling an electrode material in the contact hole to form an electrode electrically connected to the source/drain region.

10. The method of manufacturing the semiconductor device according to claim 1, wherein the gate structure comprises a gate dielectric layer contacting the doped region and a gate conductive layer stacked on the gate dielectric layer.

11. The method of manufacturing the semiconductor device according to claim 9, wherein the Halo region has the first conductive type and has a doping concentration higher than the doped region, and the source/drain region has the second conductive type and is electrically connected to the electrode.

12. The method of manufacturing the semiconductor device according to claim 1, wherein the doped region is a semiconductor substrate having the first conductive type, or a well region having the first conductive type which is formed in a semiconductor substrate.

13. The method of manufacturing the semiconductor device according to claim 12, wherein the semiconductor device is a dynamic random access memory.

14. The method of manufacturing the device according to claim 1, wherein a space between the dopant implanted region and the source/drain region is gradually increasing in a downward direction and a bottom of the dopant implanted region is higher than a bottom of the source/drain region.

* * * * *